United States Patent
Hussein et al.

(10) Patent No.: US 6,908,829 B2
(45) Date of Patent: Jun. 21, 2005

(54) METHOD OF FORMING AN AIR GAP INTERMETAL LAYER DIELECTRIC (ILD) BY UTILIZING A DIELECTRIC MATERIAL TO BRIDGE UNDERLYING METAL LINES

(75) Inventors: Makarem A. Hussein, Beaverton, OR (US); Peter Moon, Portland, OR (US); Jim Powers, Aloha, OR (US); Kevin P. O'Brien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/094,875

(22) Filed: Mar. 11, 2002

(65) Prior Publication Data

US 2003/0168747 A1 Sep. 11, 2003

(51) Int. Cl.$^7$ ............... H01L 21/76; H01L 21/4763
(52) U.S. Cl. .............. 438/421; 438/422; 438/622; 257/619; 257/411; 257/758
(58) Field of Search .................... 438/421, 422, 438/622, 619, 411; 257/619, 758, 411, 623

(56) References Cited

U.S. PATENT DOCUMENTS

| | | | | |
|---|---|---|---|---|
| 6,051,491 A | * | 4/2000 | Ito ........................ | 438/619 |
| 6,130,151 A | * | 10/2000 | Lin et al. .................... | 438/619 |
| 6,177,329 B1 | * | 1/2001 | Pang ......................... | 438/400 |
| 6,329,118 B1 | | 12/2001 | Hussein et al. | |
| 6,403,461 B1 | * | 6/2002 | Tae et al. ................... | 438/619 |
| 6,413,852 B1 | * | 7/2002 | Grill et al. ................. | 438/619 |
| 6,465,339 B2 | * | 10/2002 | Brankner et al. .......... | 438/622 |
| 6,555,467 B2 | * | 4/2003 | Hsu et al. ................... | 438/633 |

* cited by examiner

*Primary Examiner*—Nitin Parekh
(74) *Attorney, Agent, or Firm*—Blakely, Sokoloff, Taylor & Zafman LLP

(57) ABSTRACT

A method of forming an air gap intermetal layer dielectric (ILD) to reduce capacitive coupling between electrical conductors in proximity. The method entails forming first and second electrical conductors over a substrate, wherein the electrical conductors are laterally spaced apart by a gap. Then, forming a gap bridging dielectric layer that extends over the first electrical conductor, the gap, and the second electrical conductor. In order to form a bridge from one electrical conductor to the other electrical conductor, the gap bridging dielectric materials should have poor gap filling characteristics. This can be attained by selecting and/or modifying a dielectric material to have a sufficiently high molecular weight and/or surface tension characteristic such that the material does not substantially sink into the gap. An example of such a material is a spin-on-polymer with a surfactant and/or other additives.

22 Claims, 5 Drawing Sheets

METHOD OF FORMING AN AIR GAP INTERMETAL LAYER DIELECTRIC (ILD) BY UTILIZING A DIELECTRIC MATERIAL TO BRIDGE UNDERLYING METAL LINES

FIELD OF THE INVENTION

This invention relates generally to semiconductor processes and materials, and in particular, to a method of forming an air gap intermetal layer dielectric (ILD) by utilizing a dielectric material to bridge underlying metal lines.

BACKGROUND OF THE INVENTION

A continuing and ongoing trend in the semiconductor field is the ever-increasing density of circuit components in integrated circuits. More and more circuit components are being designed within a given integrated circuit area. Thus, techniques have been developed to substantially reduce the sizes of active devices, metal lines, and intermetal dielectrics, among other components.

With the reduction of circuit component sizes comes a host of problems due to the closer proximity of circuit components. One such problem is cross-talk or electromagnetic interference between adjacent circuit components. For example, a signal present on a metallization line may interfere with another signal present on an adjacent metallization line. Another problem associated with close proximity of circuit components is the potential increased signal delay and reduction in frequency bandwidth. That is, the presence of a grounded metallization layer in proximity to a metallization layer carrying a signal may decrease the signal propagation speed leading to possible delay errors. Also, a close proximity grounded layer may reduce the frequency bandwidth of the signal on an adjacent metallization line. These problems stem from the capacitive coupling between adjacent circuit components, as illustrated in the following example.

FIG. 1 illustrates a cross-sectional view of an exemplary prior art semiconductor device 100 having silicon dioxide ($SiO_2$) material serving as a intermetal layer dielectric (ILD) to separate adjacent electrically-conductive lines. The semiconductor device 100 consists of a silicon substrate 102, a pair of metallization lines 104 and 106, and a silicon dioxide ($SiO_2$) intermetal layer dielectric (ILD) 108. As alluded to, the electromagnetic interference between the adjacent metallization lines 104 and 106 is function of the capacitive coupling between the lines. The capacitive coupling, in turn, is a function of the distance between the adjacent metallization lines 104 and 106 and the relative dielectric constant of the silicon dioxide ($SiO_2$) material 108. Silicon dioxide ($SiO_2$) has a relative dielectric constant of about 4.1.

Accordingly, given a particular dielectric material such as silicon dioxide ($SiO_2$), the trend of decreasing component size to increase circuit density results in more electromagnetic coupling between adjacent components, which may adversely affect circuit performance.

DETAILED DESCRIPTION OF THE INVENTION

A method of forming an air gap intermetal layer dielectric (ILD) to reduce capacitive coupling between electrical conductors in proximity. The method entails forming first and second electrical conductors over a substrate, wherein the electrical conductors are laterally spaced apart by a gap. Then, forming a bridging dielectric layer that extends over the first electrical conductor, the gap, and the second electrical conductor. In order to form a bridge from one electrical conductor to the other electrical conductor, the bridging dielectric materials should have poor gap filling characteristics. This can be attained by selecting and/or modifying a dielectric material to have a sufficiently high molecular weight and/or surface tension characteristic such that the material does not substantially sink into the gap. An example of such a material is a spin-on-polymer with a surfactant and/or other additives. The following discussion of an embodiment serves to exemplify the method.

Figure 1:
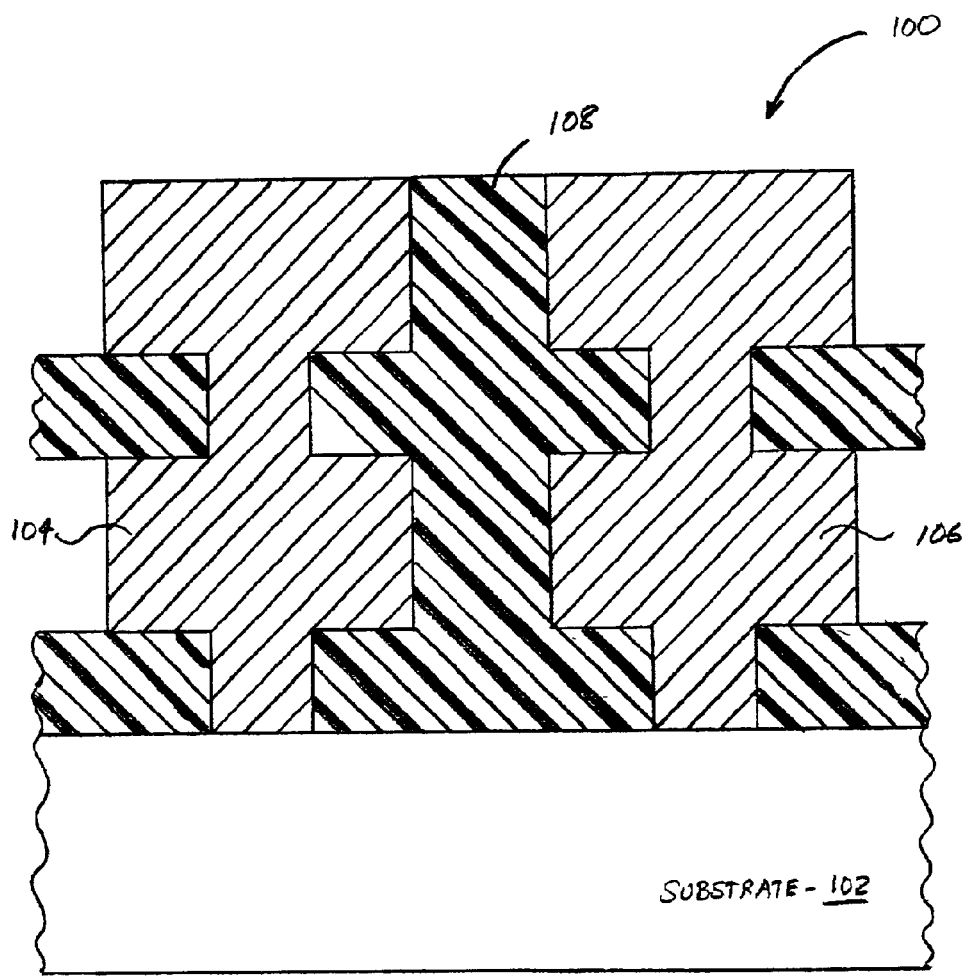
FIG. 1 illustrates a cross-sectional view of an exemplary prior art semiconductor device having a solid intermetal layer dielectric (ILD)
Figure 2A:
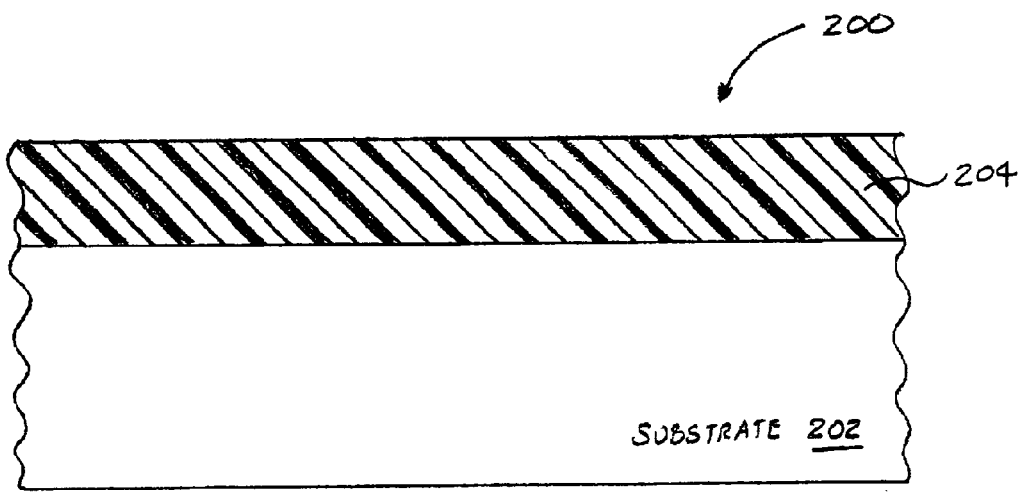
FIGS. 2A–2H illustrate cross-sectional views of an exemplary semiconductor device at various stages of an exemplary method of forming an air gap ILD in accordance with an embodiment of the invention.

FIG. 2A illustrates a cross-sectional view of an exemplary semiconductor device 200 at a stage of an exemplary method of forming an air gap intermetal layer dielectric (ILD) in accordance with an embodiment of the invention. At this stage, the semiconductor device 200 comprises a substrate 202 and a dielectric material layer 204 overlying the substrate 202. The dielectric material layer 204 may be comprised of any suitable dielectric material, such as silicon dioxide ($SiO_2$), silicon nitride ($Si_3N_4$), and/or a high-molecular weight and/or high-surface tension material, as discussed in more detail below.

Figure 2B:
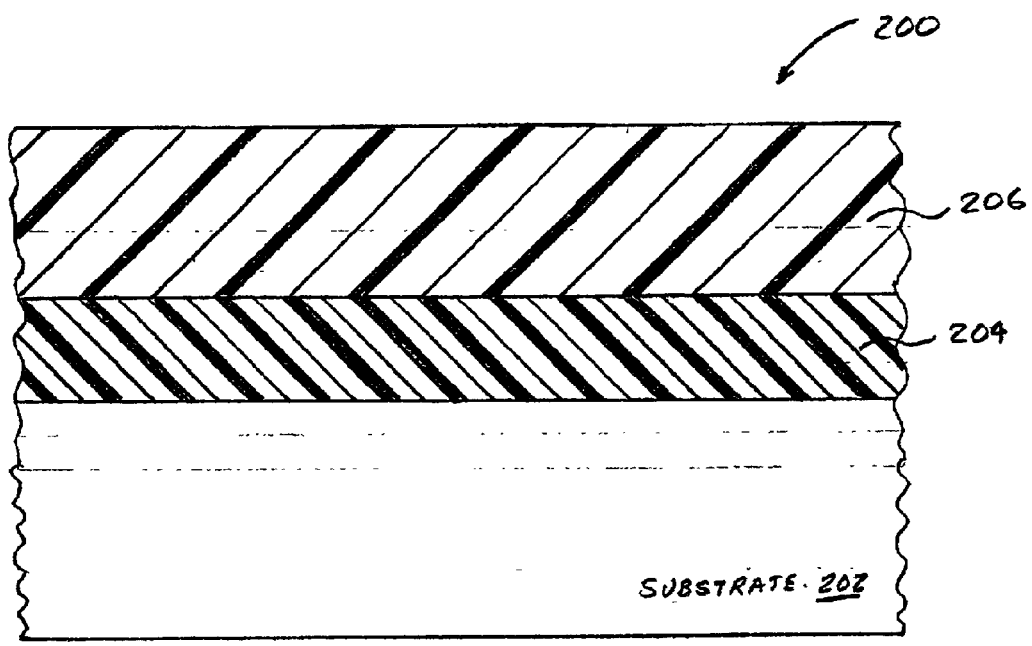

FIG. 2B illustrates a cross-sectional view of the exemplary semiconductor device 200 at a subsequent stage of the exemplary method of forming an air gap intermetal layer dielectric (ILD). According to the method, a sacrificial interlayer dielectric (ILD) material 206 is deposited over the dielectric material layer 204. Examples of suitable sacrificial ILD materials include polynorbornene, flourosilicate glass, spin-on-glass, and/or organosilicate glass. The choice of the suitable sacrificial ILD material 206 depends on the patternability of the material 206 and the ability to selectively remove the material 206 without substantially impacting the underlying dielectric layer 204.

Figure 2C:
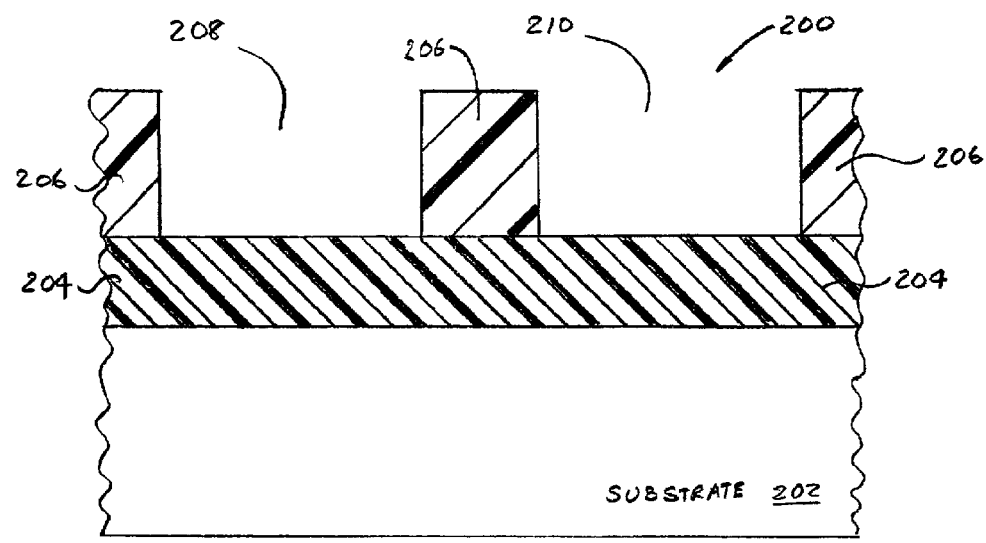

FIG. 2C illustrates a cross-sectional view of the exemplary semiconductor device 200 at another subsequent stage of the exemplary method of forming an air gap intermetal layer dielectric (ILD). According to the method, a pair of trenches 208 and 210 are formed through the sacrificial ILD material 206 to expose the underlying dielectric material layer 204. The trenches 208 and 210 can be formed by suitable anisotropic etching techniques.

Figure 2D:
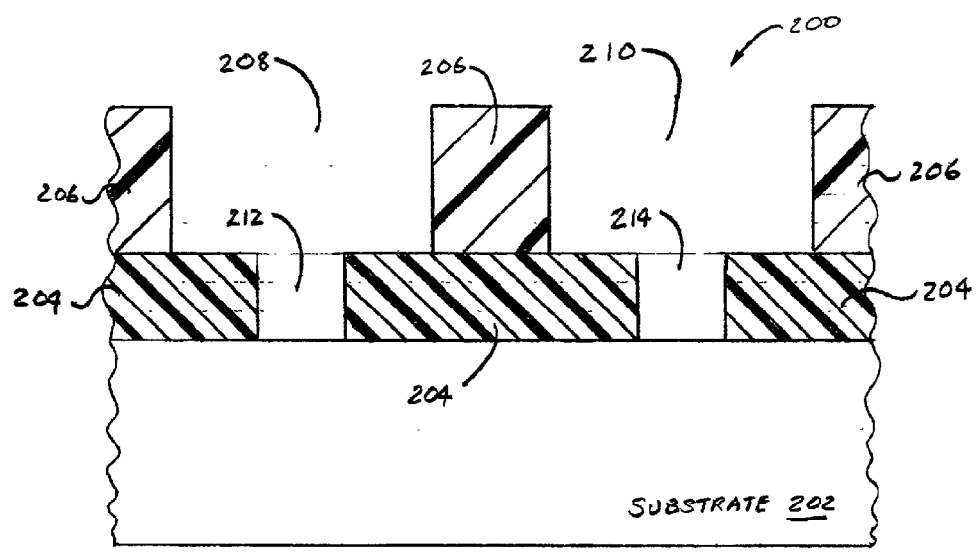

FIG. 2D illustrates a cross-sectional view of the exemplary semiconductor device 200 at another subsequent stage of the exemplary method of forming an air gap intermetal layer dielectric (ILD). According to the method, a pair of vias 212 and 214 are formed through the dielectric material layer 204 within respective trenches 208 and 210 to expose the underlying substrate 202. The vias 212 and 214 can be formed by suitable anisotropic etching techniques. Alternatively, the vias 212 and 214 may be formed before the trenches 208 and 210. That is, vias 212 and 214 are formed through both the sacrificial ILD material and the underlying dielectric material 214. Then, the trenches 208 and 210 are formed over the already-formed vias 212 and 214.

Figure 2E:
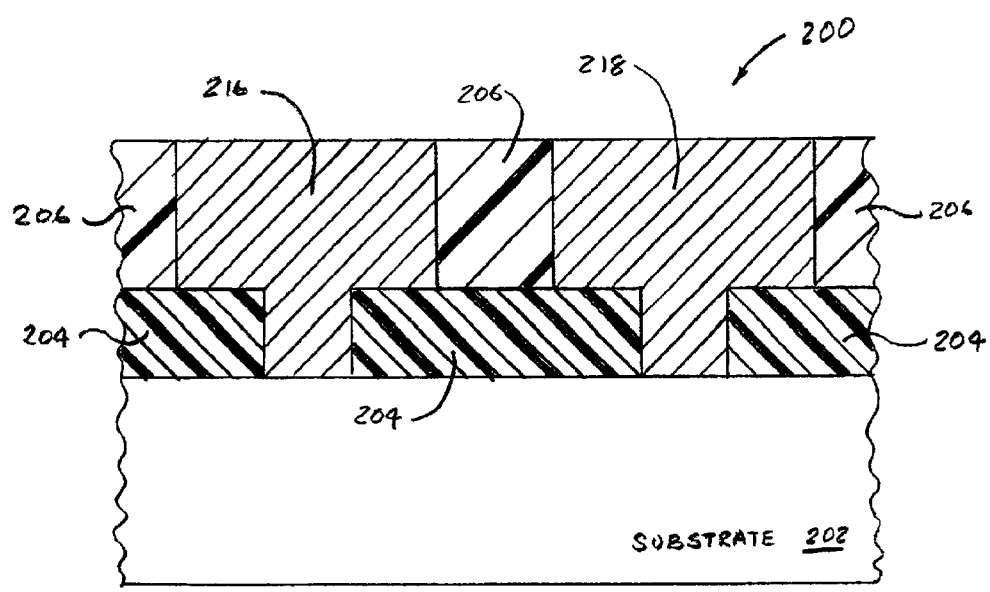

FIG. 2E illustrates a cross-sectional view of the exemplary semiconductor device 200 at another subsequent stage of the exemplary method of forming an air gap intermetal layer dielectric (ILD). According to the method, an electrically-conductive material (e.g. copper and/or aluminum metallization) is deposited to fill the vias 212 and 214 and the trenches 208 and 210. The electrically-conductive material can be deposited using suitable deposition techniques, such as sputtering. After the electrically-conductive material is deposited, it is polished back by suitable polishing techniques, such as chemical-mechanical polishing (CMP), to form electrically-conductive lines 216 and 218 (e.g. metallization lines). It shall be understood that diffusion and/or adhesion layers may be deposited to line the vias 212 and 214 and trenches 208 and 210 before the deposition of the metallization. In addition, if the metallization is to be formed by electroplating, a seed layer may be formed to line the vias 212 and 214 and trenches 208 and 210 before the deposition of the metallization.

Figure 2F:
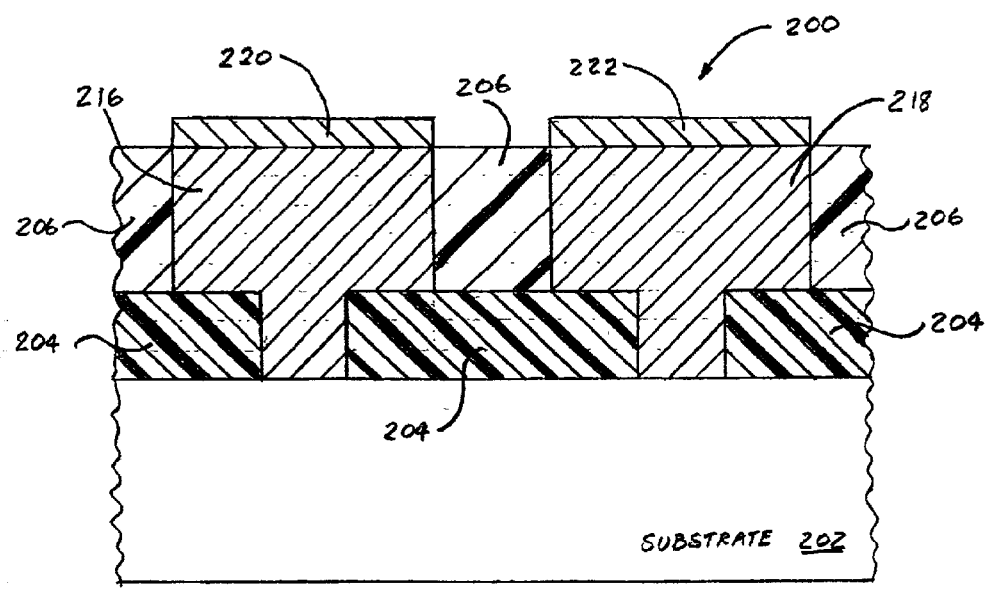

FIG. 2F illustrates a cross-sectional view of the exemplary semiconductor device 200 at another subsequent stage of the exemplary method of forming an air gap intermetal layer dielectric (ILD). According to the method, a pair of protective electrically-conductive materials 220 and 222 are deposited and patterned over respectively the two electrically conductive lines 216 and 218. The protective electrically-conductive materials 220 and 222, sometimes referred to in the relevant art as a "shunt" material, protect the underlying electrically-conductive lines 216 and 218 from oxidation, contaminants, and other adverse conditions during subsequent processing. Examples of a protective electrically-conductive material include tungsten (W) and cobalt (Co).

Figure 2G:
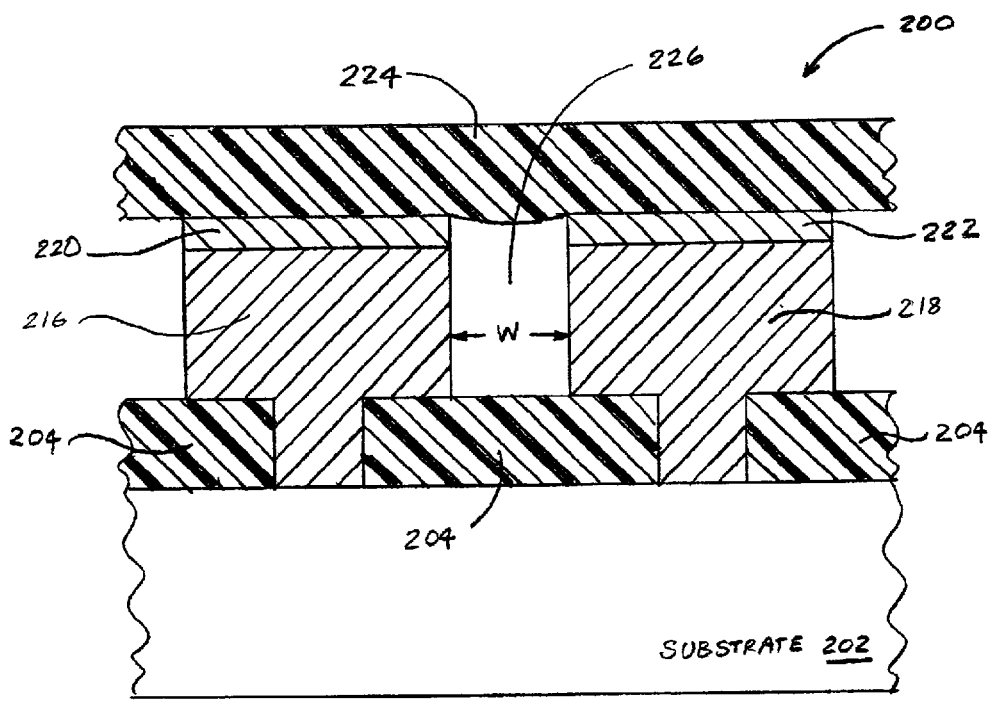

FIG. 2G illustrates a cross-sectional view of the exemplary semiconductor device 200 at another subsequent stage of the exemplary method of forming an air gap intermetal layer dielectric (ILD). According to the method, the remaining sacrificial ILD material 206 is removed between the electrically-conductive lines 216 and 216 to form a gap 226. This can be performed with an etching process that is selective to the material of the electrically-conductive lines 216 and 218, (e.g. selective to copper (Cu)). Then, a gap bridging dielectric material 224 is deposited over the protective electrically-conductive materials 220 and 222. The gap bridging dielectric material 224 extends from one of the protective electrically-conductive material 220 to the other protective electrically-conductive material 222, thereby forming an air gap intermetal layer dielectric (ILD) 226 between the electrically-conductive lines 216 and 218, and between the dielectric materials 204 and 224.

Thus, the method in accordance with an embodiment of the invention creates a gap 226 that serves as an intermetal layer dielectric (ILD) to separate and electrically isolate the adjacent electrically-conductive lines 216 and 218. Since the relative dielectric constant of the gap 226 is approximately one (1), the capacitive coupling between the electrically-conductive lines 216 and 218 is substantially minimized given a particular spacing requirement between the lines. Accordingly, adverse effects due to electromagnetic interference, signal delays, and bandwidth reduction are substantially minimized with the air gap dielectric 226 given a particular spacing requirement between the electrically-conductive lines 216 and 218.

In general, to form the gap bridging from one electrically-conductive line 216 to the other electrically-conductive line 218, the gap bridging dielectric material 224 should not substantially sink into the gap 226. Thus, the gap bridging dielectric material 224 should have a poor gap filling property. Another desirable property for the gap bridging dielectric material 226 is that its relative dielectric constant should be substantially low, such as below 3.0 in order for the dielectric material 224 to have minimal effects on the capacitive coupling between the two electrically-conductive lines 216 and 218. Yet another desirable property for the gap bridging dielectric material 224 is that the material be patternable without substantial degradation to either its dielectric constant and/or its mechanical strength. In addition, the gap bridging dielectric 224 may be annealed to cause it to shrink, thereby reducing its intrusion into the gap 226.

As an example, the gap bridging dielectric material 224 may be comprised of a spin-on-polymer which can be tuned to the desired gap filling characteristics by controlling its molecular weight and/or its surface tension characteristics. This can be done by adding surfactants or other additives to the spin-on-polymer to obtain the desired gap filling characteristics for the gap bridging dielectric material 224. Thus, the wetting properties of surfaces are used to drive the non-gap filling characteristics of the gap bridging dielectric material 224. The gap 226 may have a width W (i.e. lateral spacing) ranging from about 50 nanometers to about 500 nanometers.

Figure 2H:
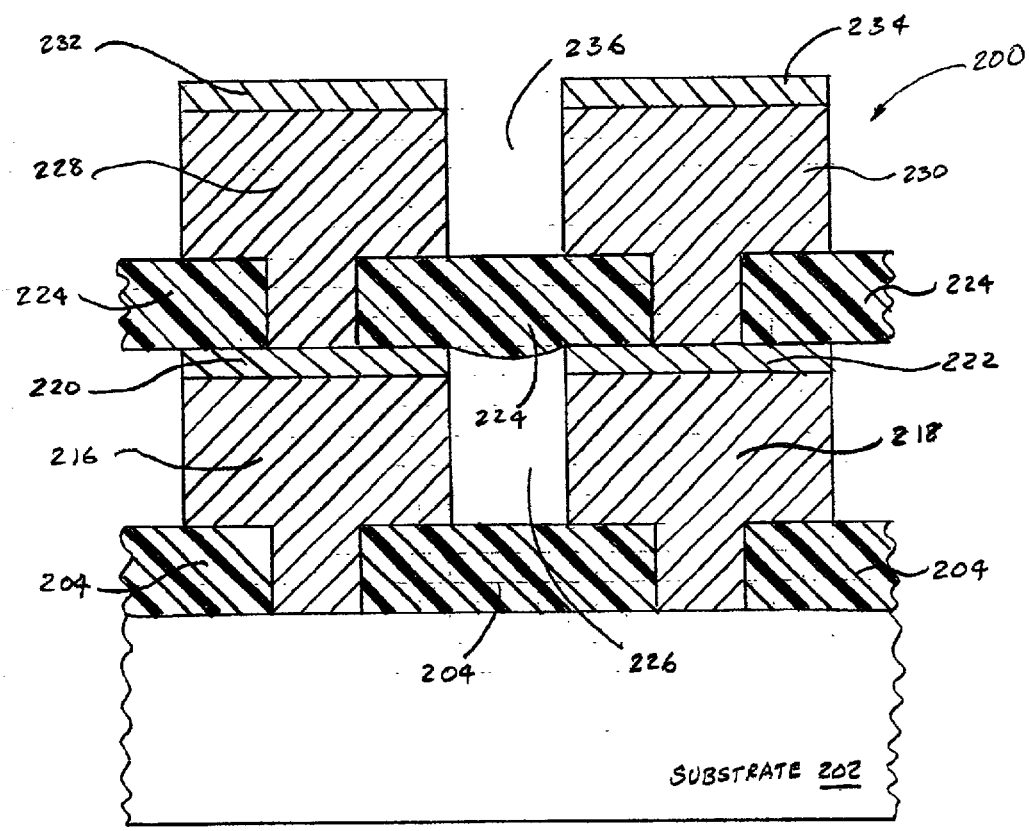

FIG. 2H illustrates a cross-sectional view of the exemplary semiconductor device 200 at another subsequent stage of the exemplary method of forming an air gap intermetal layer dielectric (ILD). The steps of the method can be repeated to form multiple levels of air gap dielectrics. For example, the steps described with reference to FIGS. 2B through 2E can be repeated to form upper electrically-conductive lines 228 and 230, protective electrically-conductive layers 232 and 234, and upper gap 236. Again, the air gap intermetal layer dielectric (ILD) reduces the capacitive coupling between electrically-conductive lines, resulting in potentially less electromagnetic interference, signal delays, and/or bandwidth reduction.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

It is claimed:

1. A method comprising:

forming a sacrificial layer over a dielectric material;

forming first and second trenches through said sacrificial layer;

forming first and second vias in the dielectric material, said vias having a width less than the width of said first and second trenches;

forming first and second electrical conductors respectively within said first and second trenches and said first and second vias;

depositing a metal layer cap over said first and second electrical conductors within said first and second trenches;

removing said sacrificial layer without use of a masked layer and after depositing the metal layer cap to form a gap between said first and second electrical conductors; and forming a gap bridging dielectric material that extends from over said first electrical conductors to over said second electrical conductor after removing said sacrificial layer.

2. The method of claim 1, wherein said first and second electrical conductors is copper.

3. The method of claim 1, wherein said metal layer cap comprises one of cobalt or tungsten.

4. The method of claim 1, wherein said gap bridging dielectric material comprises a spin-on-polymer.

5. The method of claim 4, wherein said gap bridging dielectric material further comprises a surfactant and/or other additive.

6. The method of claim 1, wherein the molecular weight and/or the surface tension characteristic of said gap bridging dielectric material is sufficient to allow said gap bridging dielectric material to bridge over said gap without substantially sinking into said gap.

7. The method of claim 1, wherein forming said first and second electrical conductors comprises depositing an electrical conductive material and planarizing said electrical conductive material.

8. The method of claim 7, further comprising forming a protective electrically conductive layer over at least said deposited electrically conductive material forming one of said plurality of electrical conductors.

9. The method of claim 1, wherein said sacrificial layer comprises polynorbornene, fluorosilicate glass, spin-on-glass, and/or organosilicate glass.

10. A method comprising:
forming a dielectric material over a substrate;
forming a sacrificial layer over the dielectric material;
forming a plurality of vias through the sacrificial layer and the dielectric material;
forming a plurality of trenches through said sacrificial layer, the plurality of trenches formed over the plurality of vias;
forming a plurality of electrical conductors within said plurality of trenches;
depositing a metal layer cap over a plurality of electrical conductors within said plurality of trenches; removing said sacrificial layer without use of a masked layer and after depositing said metal layer cap to form a gap between a first electrical conductor and a second electrical conductor of said plurality of conductors; and
forming a gap bridging dielectric material that extends from over said first electrical conductor to over said second electrical conductor and completely extending over said gap.

11. The method of claim 10, wherein at least one of said plurality of electrical conductors is a metal.

12. The method of claim 11, wherein said metal comprises copper.

13. The method of claim 10, wherein said gap bridging dielectric material comprises a spin-on-polymer.

14. The method of claim 13, wherein said gap bridging dielectric material further comprises a surfactant and/or other additive.

15. The method of claim 10, wherein a surface tension characteristic of said gap bridging dielectric material is sufficient to allow said gap bridging dielectric material to bridge over said gap without substantially sinking into said gap.

16. The method of claim 10, wherein forming said plurality of electrical conductors comprises depositing an electrical conductive material and planarizing said electrical conductive material.

17. The method of claim 10, wherein the width of said gap is greater than about 50 nanometers.

18. The method of claim 10, wherein said forming of said sacrificial layer is over a dielectric material layer and said substrate.

19. The method of claim 18, wherein said gap is bordered by said first electrical conductor and said second conductor, said dielectric material layer and said gap bridging dielectric material.

20. The method of claim 10, wherein said metal layer cap comprises one of cobalt and tungsten.

21. A method comprising:
forming a first electrical conductor using a first trench and a first via formed within a sacrificial layer and a dielectric layer;
forming a second electrical conductor using a second trench and a second via formed within said sacrificial layer and said dielectric layer;
depositing a metal layer over said first electrical conductor and said second electrical conductor;
removing said sacrificial layer without use of a masked layer to form a gap between said first electrical conductor and said second electrical conductor only after depositing said metal layer; and
forming a gap bridging dielectric material extending over said gap only after removing said sacrificial layer.

22. The method of claim 21, wherein said sacrificial layer is removed by wet etch without a masked layer.

* * * * *